US012574054B2

(12) United States Patent　　　(10) Patent No.: US 12,574,054 B2
Lindoff et al.　　　　　　　　　　(45) Date of Patent: *Mar. 10, 2026

(54) SYSTEMS AND METHODS FOR SWITCHING REFERENCE CRYSTAL OSCILLATORS FOR A TRANSCEIVER OF A WIRELESS DEVICE

(71) Applicant: Telefonaktiebolaget LM Ericsson (publ), Stockholm (SE)

(72) Inventors: Bengt Lindoff, Bjärred (SE); Magnus Åström, Lund (SE); Lars Sundström, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 66 days.

This patent is subject to a terminal disclaimer.

(21) Appl. No.: 18/481,341

(22) Filed: Oct. 5, 2023

(65) Prior Publication Data

US 2024/0030943 A1　　Jan. 25, 2024

Related U.S. Application Data

(63) Continuation of application No. 17/942,450, filed on Sep. 12, 2022, now abandoned, which is a
(Continued)

(51) Int. Cl.
　H04B 1/00　　　　(2006.01)
　H03L 7/099　　　　(2006.01)
　H04B 1/401　　　　(2015.01)
(52) U.S. Cl.
　CPC ............. H04B 1/005 (2013.01); H03L 7/099 (2013.01); H04B 1/401 (2013.01)
(58) Field of Classification Search
　CPC ...... H04B 1/005; H04B 1/401; H04B 1/0082; H04B 2215/065; H04B 1/16;
(Continued)

(56) References Cited

U.S. PATENT DOCUMENTS

| | | | |
|---|---|---|---|
| 2,726,326 A | 12/1955 | Winfield | |
| 3,883,807 A | 5/1975 | Alberkrack | |

(Continued)

FOREIGN PATENT DOCUMENTS

| | | |
|---|---|---|
| CN | 102334296 A | 1/2012 |
| GB | 2387509 A | 10/2003 |

(Continued)

OTHER PUBLICATIONS

Pidchenko, Sergey , et al., "Providing Technical Invariance of Crystal Oscillators Based on Autonomising Dual-Loop PLL System", 2018 International Conference on Information and Telecommunication Technologies and Radio Electronics (UkrMiCo), Ukraine, Odessa., Sep. 10-14, 2018, 4 pages.
(Continued)

*Primary Examiner* — Lana N Le
(74) *Attorney, Agent, or Firm* — Murphy, Bilak & Homiller, PLLC

(57)　　　　　ABSTRACT

Systems and methods are disclosed herein that relate to a wireless device that intelligently uses different reference crystal oscillators (XOs) for a Phase Locked Loop(s) (PLL(s)) in a transceiver of the wireless device. Embodiments of a method of operation of a wireless device comprising a first XO that operates at a first reference frequency and a second XO that operates at a second reference frequency that is greater than the first reference frequency are disclosed. In some embodiments, the method of operation of the wireless devices comprises deciding whether to configure a receiver of the wireless device to use the first XO or the second XO and configuring the receiver of the wireless device to use the first XO or the second XO in accordance with the decision.

20 Claims, 7 Drawing Sheets

Related U.S. Application Data continuation of application No. 17/000,884, filed on Aug. 24, 2020, now Pat. No. 11,476,877, which is a continuation of application No. 16/466,902, filed as application No. PCT/EP2016/081750 on Dec. 19, 2016, now Pat. No. 10,784,902.

(58) Field of Classification Search

CPC ..... H04B 2215/064; H03L 7/099; H03L 7/08; H03L 2207/06; H03L 7/0991; H03L 1/027; H03L 7/07; H03L 7/0995; H03L 7/095; H03L 7/0996; H03L 7/104; H03L 7/20; H03L 7/22; H03J 5/00; H03J 5/242; H03J 7/02

See application file for complete search history.

(56) References Cited

U.S. PATENT DOCUMENTS

| | | | |
|---|---|---|---|
| 4,190,803 A | | 2/1980 | Imamura |
| 4,831,339 A | | 5/1989 | Nemeth |
| 5,230,094 A | * | 7/1993 | Kitching ................. H04B 1/26 |
| | | | 455/296 |
| 5,890,051 A | * | 3/1999 | Schlang .............. H04B 1/0057 |
| | | | 455/76 |
| RE36,973 E | | 11/2000 | Shigemori |
| 6,308,048 B1 | * | 10/2001 | Gore ...................... H04B 1/005 |
| | | | 455/189.1 |
| 6,408,010 B1 | | 6/2002 | Stroet |
| 6,484,038 B1 | | 11/2002 | Gore et al. |
| 6,970,045 B1 | | 11/2005 | Lichter et al. |
| 7,027,833 B1 | | 4/2006 | Goodman |
| 7,145,402 B2 | | 12/2006 | Mattila et al. |
| 7,301,404 B2 | | 11/2007 | Mattisson |
| 7,430,402 B2 | | 9/2008 | Makarov |
| 7,456,699 B2 | | 11/2008 | Mccorquodale et al. |
| 7,786,817 B2 | | 8/2010 | Sutardja |
| 7,940,830 B2 | * | 5/2011 | Marsili ............... H04B 1/7136 |
| | | | 331/46 |
| 9,654,117 B1 | | 5/2017 | Landheer |
| 10,148,274 B1 | | 12/2018 | Jin |
| 10,652,068 B2 | | 5/2020 | Axmon et al. |
| 10,784,902 B2 | * | 9/2020 | Lindoff .................. H04B 1/005 |
| 11,476,877 B2 | | 10/2022 | Lindoff et al. |
| 11,936,388 B2 | * | 3/2024 | Lee ........................... H03L 7/08 |
| 2001/0001616 A1 | | 5/2001 | Rakib et al. |
| 2003/0231066 A1 | | 12/2003 | Ormson et al. |
| 2004/0012447 A1 | | 1/2004 | Nagaishi et al. |
| 2004/0071029 A1 | | 4/2004 | Sutardja |
| 2005/0078773 A1 | | 4/2005 | Astrachan |
| 2005/0195105 A1 | | 9/2005 | Mcburney et al. |
| 2006/0089115 A1 | | 4/2006 | Goodman |
| 2007/0149143 A1 | | 6/2007 | Kim et al. |
| 2007/0152758 A1 | | 7/2007 | Shimomura et al. |
| 2007/0222529 A1 | | 9/2007 | Carichner et al. |
| 2007/0226531 A1 | | 9/2007 | Park et al. |
| 2008/0224782 A1 | | 9/2008 | Fan et al. |
| 2008/0248765 A1 | | 10/2008 | Gater |
| 2011/0129006 A1 | * | 6/2011 | Jung ................... H04L 27/0006 |
| 2011/0321106 A1 | * | 12/2011 | Takahashi ................ H04B 1/40 |
| 2014/0086209 A1 | | 3/2014 | Su et al. |
| 2014/0218119 A1 | * | 8/2014 | He .......................... H03L 1/022 |
| 2015/0055737 A1 | | 2/2015 | Bourdi et al. |
| 2015/0056934 A1 | | 2/2015 | Griffith et al. |
| 2015/0236887 A1 | | 8/2015 | Kaukovuori et al. |
| 2015/0311906 A1 | | 10/2015 | Nilsson |
| 2016/0100448 A1 | | 4/2016 | Su et al. |
| 2016/0344527 A1 | * | 11/2016 | Blankenship ........... H04W 4/70 |
| 2017/0214516 A1 | | 7/2017 | Rivaud et al. |
| 2017/0302310 A1 | * | 10/2017 | Mukherjee ............... H04B 1/16 |
| 2019/0020361 A1 | * | 1/2019 | Tong ..................... H04B 1/005 |
| 2019/0386688 A1 | * | 12/2019 | Choi .................... H04B 1/0082 |
| 2022/0006463 A1 | * | 1/2022 | Kuboshima ............. H03L 7/099 |
| 2022/0321104 A1 | | 10/2022 | Cassella |

FOREIGN PATENT DOCUMENTS

| | | |
|---|---|---|
| GB | 2425233 A | 10/2006 |
| GB | 2425233 B | 6/2007 |
| JP | S62243433 A | 10/1987 |
| JP | 1995095110 A | 4/1995 |
| JP | 2003332939 A | 11/2003 |
| JP | 2004056172 A | 2/2004 |
| JP | 2004312588 A | 11/2004 |
| JP | 2005303962 A | 10/2005 |
| JP | 2004376979 A | 7/2006 |
| JP | 2006180165 A | 7/2006 |
| JP | 2006186576 A | 7/2006 |
| JP | 2014068093 A | 4/2014 |
| KR | 20010010375 A | 2/2001 |
| KR | 100326755 | 3/2002 |
| KR | 20040043445 A | 5/2004 |
| KR | 20070043445 A | 4/2007 |
| KR | 100754186 B1 | 9/2007 |
| KR | 20110110128 A | 10/2011 |
| RU | 2409905 C2 | 1/2011 |
| WO | 2009145525 A2 | 12/2009 |
| WO | 2010073632 A1 | 7/2010 |
| WO | 2015091141 A1 | 6/2015 |
| WO | 2016022227 A1 | 2/2016 |

OTHER PUBLICATIONS

"NEL Frequency Controls Develops Dual Frequency OCXO Reference Module", NEL Frequency Controls, http://www.rfglobalnet. com/doc/nel-frequency-controls-develops-dual-frequency-ocxo-reference-module-0001, Jun. 15, 2012, 1-2.

Xingchun, Wang , et al., "Design of low phase noise reference signal synthesizer", The 41st Institute of CETC, Quingdao 266555, DOI: 10.19652, Nov. 24, 2007, 4 pages.

* cited by examiner

SYSTEMS AND METHODS FOR SWITCHING REFERENCE CRYSTAL OSCILLATORS FOR A TRANSCEIVER OF A WIRELESS DEVICE

RELATED APPLICATIONS

This application is a continuation of U.S. application Ser. No. 17/942,450 filed 12 Sep. 2022, which is a continuation of U.S. application Ser. No. 17/000,884 filed 24 Aug. 2020 and now issued as U.S. Pat. No. 11,476,877, which is a continuation of U.S. application Ser. No. 16/466,902 filed 5 Jun. 2019 and now issued as U.S. Pat. No. 10,784,902, which is a U.S. National Phase Application of PCT/EP2016/081750 filed 19 Dec. 2016. The entire contents of each aforementioned application is incorporated herein by reference.

TECHNICAL

The present disclosure relates to switching between different reference crystal oscillators (XOs) for a transceiver of a wireless device.

BACKGROUND

With the introduction of the Fifth Generation (5G) of cellular communications systems, new radio frequencies at 10 gigahertz (GHz) and higher are expected to be used together with the 1 to 3 GHz carriers used in the Second/Third/Fourth Generation (2G/3G/4G) cellular communications system deployments of today. Furthermore, 5G cellular communications systems are expected to support of a variety of services and use cases, from low power/low cost Machine Type Communication (MTC) up to "fiber replacement" Mobile Broadband (MBB) services with data rates above 1 gigabits per second (Gb/s). The latter use case requires high system bandwidth, and hence will be deployed on carriers at 10 GHz and higher. Furthermore, enhanced MBB typically needs higher order modulation (e.g., 64/256/1024—Quadrature Amplitude Modulation (QAM)) and good Signal-to-Noise Ratios (SNRs). High SNRs can be achieved by utilizing massive antenna and beam forming techniques. All in all, such a use case will set very tough requirements on the radio of the wireless device and impairments. For example, phase noise introduced at the radio of the wireless device will need to be small for high carrier frequencies beyond 10 GHz.

In this regard, the receiver of the wireless device includes the Phase Locked Loop (PLL) that controls a Controlled Oscillator (CO) to generate the Local Oscillator (LO) signal used by the receiver. The CO typically dominates power consumption and phase noise and, as such, the CO serves as a good reference for the understanding of phase noise at high frequencies. The CO performance is commonly captured through a Figure of Merit (FoM) allowing for a comparison of different CO implementations and is defined by:

$$FoM = PN_{CO}(df) - 20 \, \log\left(\frac{f_o}{df}\right) + 10\log(P_{DC}/1 \, \text{mW}).$$

Here, $PN_{CO}(df)$ is the phase noise of the CO in decibels relative to the carrier per Hertz (dBc/Hz) at a frequency offset df with oscillation frequency $f_o$ (both in Hertz (Hz)) and power consumption $P_{DC}$ in milliwatts (mW). One noticeable result of this expression is that both phase noise and power consumption in linear power are proportional to $f_o{}^2$. Thus, to maintain a phase noise level at a certain offset while increasing $f_o$ by a factor R would require the power to be increased by $R^2$ (assuming a fixed FoM). Conversely, for a fixed power consumption and FoM the phase noise will increase by $R^2$, or 6 decibels (dB) per every doubling of $f_o$.

The FoM definition aims to be frequency agnostic but, in practice, there is an additional implementation penalty associated with higher frequencies as shown in FIG. 1 where FoM of recently published Voltage Controlled Oscillator (VCO) designs in Complementary Metal-Oxide-Semiconductor (CMOS) technology are compared. The penalty is roughly 10 dB/decade.

Thus, preserving a low phase noise level at higher frequencies calls for a reevaluation of the design of the PLL. One way to further suppress the phase noise from the CO is to increase the PLL bandwidth. In doing so, the phase noise will, to a larger extent, be determined by phase from the PLL as such and possibly even more from the reference crystal oscillator (XO). The phase noise level from the XO referred to the CO output is "amplified" by the frequency ratio $20 \log_{10} (f_o/f_{XO})$ [dB]. This phase noise amplification and the need for a larger PLL bandwidth both call for an increased XO frequency as compared to that of XOs conventionally used in wireless devices, such as smart phones. Specifically, the XOs conventionally used in wireless devices typically have a reference frequency in the range of 20-40 megahertz (MHz). However, in order to preserve a low phase noise level for carrier frequencies of 10 GHz and above by mitigating phase noise amplification and using a larger PLL bandwidth, a XO frequency of 100 MHz or more is needed.

This increase in XO frequency from less than 50 MHz to greater than or equal to 100 MHz is a discontinuous step with regards to manufacturing and mechanical structure of the resonator (crystal) used in the XO. These high frequency XOs comes with some issues and drawbacks over the conventional 20-40 MHz XOs. For instance, frequency tolerance, variations versus temperature, and aging are each much larger for a high frequency XO as compared to a 20-40 MHz XO. As an example, a 26 MHz XO may have a tolerance of 10 parts-per-million (ppm), while a >100 MHz XO may have a tolerance of 40-50 ppm. Another disadvantage is that the power consumption of a high frequency XO may be 5 to 10 times greater than that of a 20-40 MHz XO.

Thus, there is a need for systems and methods for mitigating the issues (e.g., lower tolerance and increased power consumption) associated with a high frequency XO when implemented as a reference for a PLL of a wireless device.

SUMMARY

Systems and methods are disclosed herein that relate to a wireless device that intelligently uses different reference crystal oscillators (XOs) for a Phase Locked Loop(s) (PLL(s)) in a transceiver of the wireless device. Embodiments of a method of operation of a wireless device comprising a first XO that operates at a first reference frequency and a second XO that operates at a second reference frequency that is greater than the first reference frequency are disclosed. In some embodiments, the method of operation of the wireless device comprises making a decision as to whether to configure a receiver of the ireless device to use the first XO or the second XO and configuring the receiver of the wireless device to use the first XO or the second XO in accordance with the decision. In this manner, the receiver of the wireless device can be configured to utilize the lower-frequency first XO when, e.g., the higher-frequency second XO is not needed thereby avoiding the lower tolerance and increased power consumption of the higher-frequency second XO. Likewise, the receiver of the wireless device can be configured to utilize the higher-frequency second XO when, e.g., the higher-frequency XO is desirable to achieve an acceptable level of phase noise, e.g., when operating at a high (e.g., millimeter wave (mmW)) carrier frequency.

In some embodiments, upon making the decision to configure the receiver of the wireless device to use the first XO, configuring the receiver of the wireless device to use the first XO or the second XO in accordance with the decision comprises configuring the receiver of the wireless device to use the first XO. Further, in some embodiments, configuring the receiver of the wireless device to use the first XO comprises connecting a PLL of the receiver of the wireless device to the first XO and configuring the PLL based on the first reference frequency such that a Controlled Oscillator (CO) that is controlled by the PLL provides an output signal at a desired Local Oscillator (LO) frequency.

In some embodiments, the method further comprises, upon making the decision to configure the receiver of the wireless device to use the first XO, activating the first XO prior to configuring the receiver of the wireless device to use the first XO.

In some embodiments, the method further comprises, upon making the decision to configure the receiver of the wireless device to use the first XO, deactivating the second XO if the second XO is active after configuring the receiver of the wireless device to use the first XO.

In some embodiments, upon making the decision to configure the receiver of the wireless device to use the second XO, configuring the receiver of the wireless device to use the first XO or the second XO in accordance with the decision comprises configuring the receiver of the wireless device to use the second XO. Further, in some embodiments, configuring the receiver of the wireless device to use the second XO comprises connecting a PLL of the receiver of the wireless device to the second XO and configuring the PLL based on the second XO such that a CO that is controlled by the PLL provides an output signal at a desired LO frequency.

In some embodiments, the method further comprises, upon making the decision to configure the receiver of the wireless device to use the second XO, activating the first XO and activating the second XO prior to configuring the receiver of the wireless device to use the second XO.

In some embodiments, the method further comprises, upon making the decision to configure the receiver of the wireless device to use the second XO, causing adaptation of the second XO based on an output of the first XO. Further, in some embodiments, the first XO was previously tuned during a synchronization process in which the wireless device was synchronized to a radio access node in a wireless communication system.

In some embodiments, the method further comprises, upon making the decision to configure the receiver of the wireless device to use the second XO, deactivating the first XO after configuring the receiver of the wireless device to use the second XO.

In some embodiments, the method further comprises detecting an event that that may trigger a change in which of the first XO and the second XO is used by the receiver of the wireless device, and making the decision as to whether to configure the receiver of the wireless device to use the first XO or the second XO comprises making the decision upon detecting the event.

In some embodiments, making the decision as to whether to configure the receiver of the wireless device to use the first XO or the second XO comprises making the decision based on whether or not the wireless device is synchronized to a wireless network. Further, in some embodiments, the decision is to use the first XO if the wireless device is not synchronized to a wireless network and the decision is to use the second XO if the wireless device is synchronized to a wireless network.

In some embodiments, the method further comprises activating the first XO, configuring the receiver of the wireless device to use the first XO, configuring the receiver of the wireless device to operate at a carrier frequency $f_C$, and performing an initial cell search at the carrier frequency $f_C$. Further, making the decision as to whether to configure the receiver of the wireless device to use the first XO or the second XO comprises determining whether a synchronization signal was detected while performing the initial cell search at the carrier frequency $f_C$ such that the decision is to continue to use the first XO if a synchronization signal was not detected and to use the second XO if a synchronization signal was detected.

Further, in sonic embodiments, the method further comprises, upon determining that a synchronization signal was detected while performing the initial cell search at the carrier frequency $f_C$, adapting the first XO and/or a PLL that generates a LO signal for the receiver of the wireless device based on the output of the first XO to synchronize to the wireless network, activating the second XO, and adapting the second XO based on the first XO. Further, configuring the receiver of the wireless device to use the first XO or the second XO in accordance with the decision comprises configuring the receiver of the wireless device to use the second XO after adapting the second XO.

Further, in sonic embodiments, the method further comprises, upon determining that a synchronization signal was detected while performing the initial cell search at the carrier frequency $f_C$, disabling the first XO after configuring receiver of the wireless device to use the second XO.

In some embodiments, making the decision as to whether to configure the receiver of the wireless device to use the first XO or the second XO comprises making the decision based on a connection state of the wireless device with respect to a wireless network. Further, in some embodiments, the connection state is a Radio Resource Control (RRC) state of the wireless device.

In some embodiments, making the decision based on the connection state of the wireless device with respect to the wireless network comprises making the decision to use the first XO if the connection state of the wireless device is an idle state and making the decision to use the second XO if the connection state of the wireless device is a connected state.

In some embodiments, making the decision as to whether to configure the receiver of the wireless device to use the first XO or the second XO comprises making the decision based on a carrier frequency of a signal to be received by the receiver the wireless device. In some embodiments, making the decision based on the carrier frequency of the signal to be received by the receiver the wireless device comprises making the decision to use the first XO if the carrier frequency is less than a predefined or preconfigured threshold and making the decision to use the second XO if the carrier frequency is greater than the predefined or preconfigured threshold. In some embodiments, the predefined or preconfigured threshold is greater than or equal to 4 gigahertz (GHz). In some other embodiments, the predefined or preconfigured threshold is greater than or equal to 10 GHz.

In some embodiments, the first reference frequency is less than or equal to 52 megahertz (MHz), and the second reference frequency is greater than or equal to 100 MHz.

Embodiments of a wireless device comprising a first XO that operates at a first reference frequency and a second XO that operates at a second reference frequency that is greater than the first reference frequency are also disclosed. In some embodiments, the wireless device is adapted to make a decision as to whether to configure a receiver of the wireless device to use the first XO or the second XO and configure the receiver of the wireless device to use the first XO or the second XO in accordance with the decision.

In some embodiments, the wireless device is further adapted to operate according to the method of operation according to any one of the embodiments disclosed herein.

In some embodiments, a wireless device comprises a first XO that operates at a first reference frequency and a second XO that operates at a second reference frequency that is greater than the first reference frequency. The wireless device further comprises a control unit comprising a decision module and a configuring module. The decision module s operable to make a decision as to whether to configure a receiver of the wireless device to use the first XO or the second XO. The configuring module is operable to configure the receiver of the wireless device to use the first XO or the second XO in accordance with the decision.

Those skilled in the art will appreciate the scope of the present disclosure and realize additional aspects thereof after reading the following detailed description of the embodiments in association with the accompanying drawing figures.

BRIEF DESCRIPTION OF THE DRAWINGS

The accompanying drawing figures incorporated in and forming a part of this specification illustrate several aspects of the disclosure, and together with the description serve to explain the principles of the disclosure.

DETAILED DESCRIPTION

Figure 1:
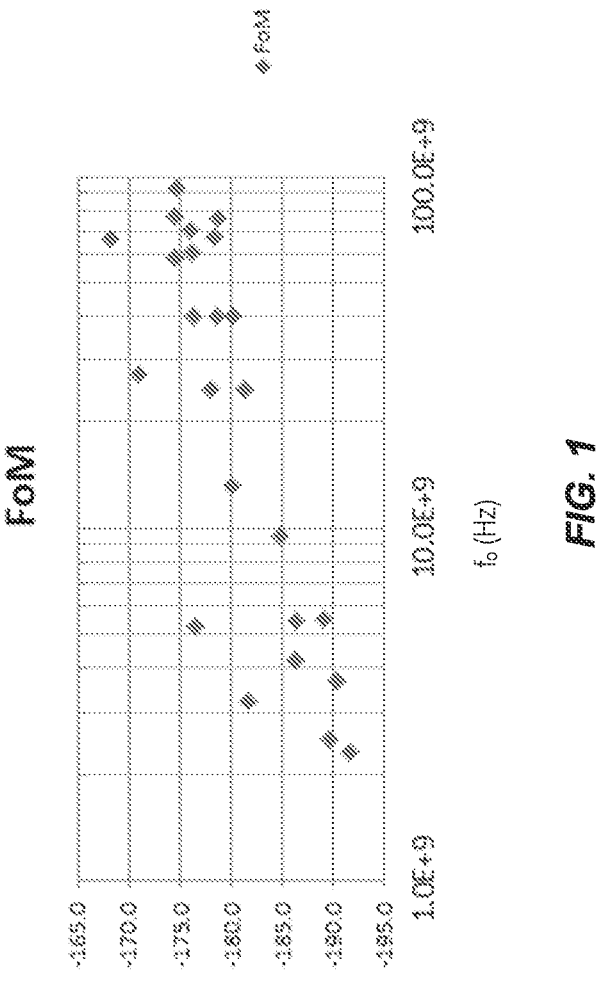
FIG. 1 graphically illustrates Figure of Merit (FoM) values for a number of recently published Voltage Controlled Oscillator (VCO) designs in Complementary Metal-Oxide-Semiconductor (CMOS) technology.

The embodiments set forth below represent information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Radio Node: As used herein, a "radio node" is either a radio access node or a wireless device.

Radio Access Node: As used herein, a "radio access node" is any node in a radio access network of a cellular communications network that operates to wirelessly transmit and/or receive signals. Some examples of a radio access node include, but are not limited to, a base station (e.g., an enhanced or evolved Node B (eNB) in a Third Generation Partnership Project (3GPP) Long Term Evolution (LTE) network), a g Node B (i.e., Fifth Generation (5G), Next Generation or New Radio (NR) eNB), a high-power or macro base station, a low-power base station (e.g., a micro base station, a pico base station, a home eNB, or the like), and a relay node.

Core Network Node: As used herein, a "core network node" is any type of node in a Core Network (CN). Some examples of a core network node include, e.g., a Mobility Management Entity (MME), a Packet Data Network (PDN) Gateway (P-GW), a Service Capability Exposure Function (SCEF), or the like.

Wireless Device: As used herein, a "wireless device" is any type of device that has access to (i.e., is served by) a cellular communications network by wirelessly transmitting and/or receiving signals to a radio access node(s). Some examples of a wireless device include, but are not limited to, a User Equipment device (UE) in a 3GPP network and a Machine Type Communication (MTC) device.

Network Node: As used herein, a "network node" is any node that is either part of the radio access network or the CN of a cellular communications network/system.

Note that the description given herein focuses on a 3GPP cellular communications system and, as such, 3GPP LTE terminology or terminology similar to 30PP LTE terminology is oftentimes used. However, the concepts disclosed herein are not limited to LTE or a 3GPP system.

Note that, in the description herein, reference may be made to the term "cell;" however, particularly with respect to 5G concepts, beams may be used instead of cells and, as such, it is important to note that the concepts described herein are equally applicable to both cells and beams.

Systems and methods are disclosed herein that relate to a wireless device that uses two reference crystal oscillators (XOs) for a Phase Locked Loop(s) (PLL(s)) in a transceiver of the wireless device. The two XOs include a first XC) having a first reference frequency and a second XO having a second reference frequency that is greater than the first reference frequency. For example, in one embodiment, the first reference frequency is less than 52 megahertz (MHz) (e.g., in the range of and including 20 to 40 MHz) and the second reference frequency is greater than or equal to 100 MHz. The wireless device decides whether to use the first XO or the second XO based on, e.g., whether the wireless device is in an Out-of-Sync (OOS) state or an in-sync state with respect to a wireless communications network, a connection state of the wireless device with respect to the wireless communication network, and/or a carrier frequency at which the transceiver of the wireless device is configured.

As one example, in some embodiments, the wireless device configures a transceivers) of the wireless device to use the first XO during an initial synchronization procedure by which the wireless device synchronizes to a wireless communications network. During the initial synchronization procedure, phase noise requirements are not so stringent since synchronization signals transmitted by the wireless communications network should be able to be detected at low Signal-to-Noise Ratios (SNRs), and hence are typically modulated using a robust modulation scheme (e.g., Binary Phase Shift Keying (BPSK) or are robust in other way(s) (e.g., only a few possible known sequences for the synchro- nization signals). Once initial synchronization is made towards a radio access node in the wireless communications system, the wireless device configures the transceivers) to use the second XO. In some embodiments, prior to config- uring the transceiver(s) to use the second XO, the first XO is tuned towards the carrier frequency of the radio access node, or alternatively a dc-rotator is used compensate for the frequency error in the digital domain. As yet another alter- native, the divider used in the PLL can be adjusted so as to compensate for the incorrect XO frequency. Note that, regardless of which technique is used to tune the first XO, they all have the same effect with regards to the resulting baseband receive signal in the digital domain being correctly downconverted from RF. Then, the second XO is enabled and tuned (or locked in another PLL) towards the first XO and carrier frequency of the radio access node. Once the second XO has been tuned, the wireless device configures the transceiver(s) to use the second XO for the active operation of the PLL(s) in the wireless device. Hence, the higher frequency, second XO can fulfill the more stringent phase noise requirements needed for high data rate trans- mission and reception using a carrier frequency of 10 gigahertz (GHz) or higher. In some embodiments, the above procedure is repeated when the wireless device determines that a re-sync is needed due to long Discontinuous Recep- tion (DRX) cycles, detection of large temperature variations, etc.

Figure 2:
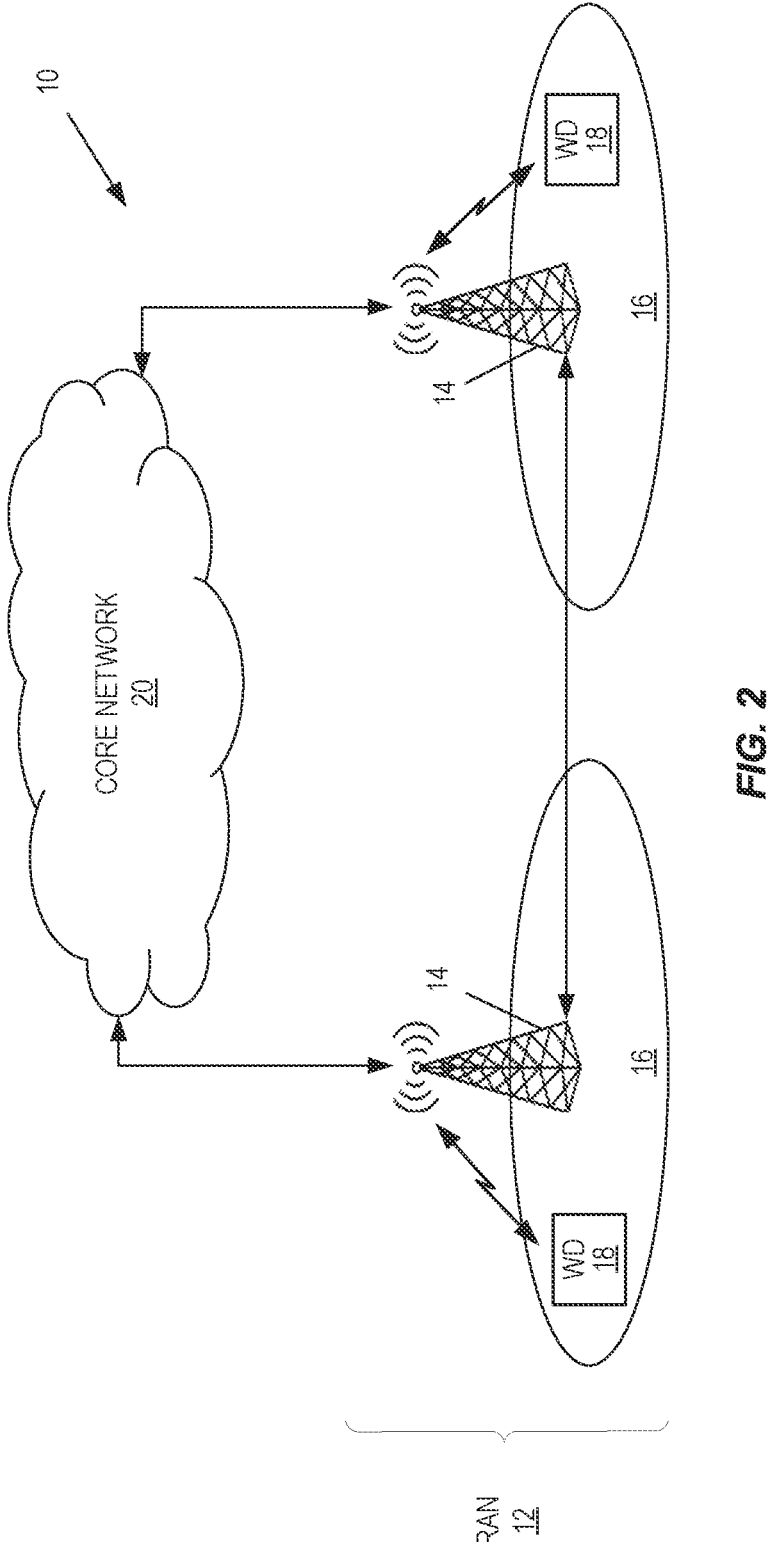
FIG. 2 illustrates one example of a wireless communications system in which embodiments of the present disclosure may be implemented.

In this regard, FIG. 2 illustrates one example of a wireless communications system in which embodiments of the pres- ent disclosure may be implemented. In this example, the wireless communications system is a cellular communica- tions system 10. The cellular communications system 10 includes a Radio Access Network (RAN) 12 that includes a number of radio access nodes 14 (e.g., base stations, eNBs, gNBs, or the like) serving corresponding cells 16 or beams. The radio access nodes 14 provide wireless connectivity (i.e., radio access) to wireless devices 18 (e.g., UEs, MTC devices, or the like). The radio access nodes 14 are con- nected to one another via a corresponding interface (e.g., an X2 interface in 3GPP) and connected to a core network 20 via a core network interface (e.g., a S1 interface in 3GPP).

Figure 3:
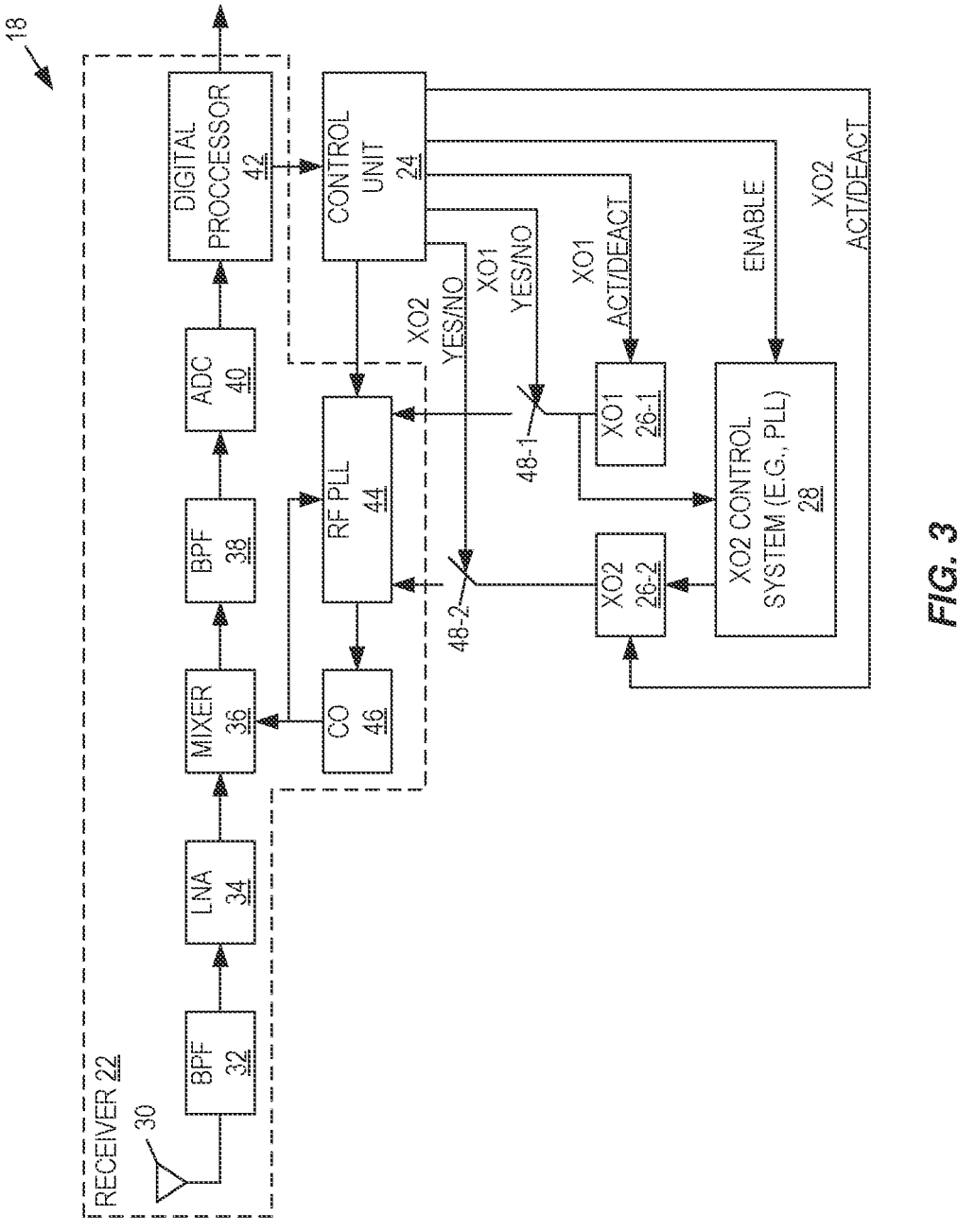
FIG. 3 illustrates one example of the wireless device according to some embodiments of the present disclosure.

FIG. 3 illustrates one example of the wireless device 18 according to some embodiments of the present disclosure. Note that in this example, the wireless device 18 is illus- trated as including a receiver 22. Note, however, that the concepts disclosed herein are equally applicable to the use of XOs to generate Local Oscillator (LO) signals for a trans- mitter(s) and/or receiver(s) of the wireless device 18. As illustrated, the wireless device 18 includes the receiver 22, a control unit 24, a first XO (XO1) 26-1 that outputs a reference signal having a first reference frequency, a second XO (XO2) 26-2 that outputs a reference signal having a second reference frequency that is greater than the first reference frequency, and a XO2 control system 28. As an example, the first reference frequency is less than 52 MHz (e.g., in the range of and including 20 to 40 MHz), and the second reference frequency is greater than or equal to 100 MHz. The control unit 24 is implemented in hardware or a combination of hardware and software. For example, the control unit 24 may be implemented as a processing circuit that includes one or more processors (e.g., Central Process- ing Units (CPUs), Application Specific Integrated Circuits (ASICs), Field Programmable Gate Arrays (FPGAs), or the like), where the processing circuit executes software that causes the control unit 24 to thereby provide the function- ality of the control unit 24 described herein.

While the receiver 22 may include various analog and digital circuits, in the illustrated example, the receiver 22 includes an antenna(s) 30, a Band-Pass Filter (BPF) 32, a Low-Noise Amplifier (LNA) 34, a mixer 36, a BPF 38, an Analog-to-Digital Converter (ADC) and a digital processor 42. In addition, the receiver 22 includes a Radio Frequency (RF) PLL 44 that controls a Controlled Oscillator (CO) 46 to provide a LO signal to the mixer 36. In operation, a RF receive signal is received via the antenna 30 and filtered by the BPF 32 to thereby provide a filtered, RF receive signal. The filtered, RF receive signal is amplified by the LNA 34 to provide amplified and filtered RF receive signal, which is then downconverted from RF to, in this example, baseband at the mixer 36. In order to provide this downconrversion from RF to baseband, the RF PLL 44 is configured by the control unit 24 such that, based on a reference frequency provided by either the XO1 26-1 or the XO2 26-2 depending on the configuration, the LO signal output by the CO 46 is equal to the carrier frequency fC of a desired receive signal. Note, however, that downconversion may alternatively be to a desired Intermediate Frequency (IF), in which case the frequency of the LO signal generated by the CO 46 is controlled to be the appropriate frequency ceded for down- conversion from fC to the desired IF.

As discussed below, the control unit 24 configures the receiver 22 to use either the XO1 26-1 or the XO2 26-2 based on one or more criteria. The one or more criteria may include, for example, a synchronization state of the wireless device 18, a connection state of the wireless device 18 (e.g., Radio Resource Control (RRC) IDLE or RRC CON- NECTED), and/or the carrier frequency fC of the desired receive signal (i.e., the carrier frequency of the radio access node 14). Thus, in one configuration, the control unit 24 configures the RF PLL 44 to use the XO1 26-1. In the illustrated example, this configuration of the RF PLL 44 to use the XO1 26-1 includes closing a switch 48-1 and configuring settings (e.g., divider value(s)) of the RF PLL 44 such that the RF PLL 44 will control the CO 46 to provide the desired LO frequency based on the reference frequency of the XO1 26-1. In another configuration, the control unit 24 configures the RF PLL 44 to use the XO2 26-2. In the illustrated example, this configuration of the RF PLL 44 to use the XO2 26-2 includes closing a switch 48-2 and configuring settings (e.g., divider value(s)) of the RF PLL 44 such that the RF PLL 44 will control the CO 46 to provide the desired LO frequency based on the reference frequency of the XO2 26-2. In some embodiments, prior to configuring the receiver 22 to use the XO2 26-2, the XO2 control system 28, which may be implemented as a PLL, is enabled, and operates to adapt the XO2 26-2 based on the signal output by the XO1 26-1. In this case, the XO1 26-1 has previously be adapted, or tuned, according to the carrier frequency of the radio access node 14 and, as such, can be used to provide initial adaptation, or tuning, of the XO2 26-2 prior to the XO2 26-2 being connected to the RF PLL 44.

Thus, the control unit 24 can intelligently control which of the XOs 26-1 and 26-2 is used by the receiver 22 based on the one or more criteria. In doing so, various advantages can be realized. For example, the control unit 24 can configure the receiver 22 to use the XO1 26-1 and deactivate the XO2 26-2 when in an OOS (out-of-sync) state, when in IDLE mode, and/or when operating at a low carrier fre- quency (e.g., fC<4 GHz or, as another example, fC<10 GHz)

and configure the receiver 22 to use the XO2 26-2 and optionally deactivate the XO1 26-1 when in an in-sync state, when in a connected mode, and/or when operating at a carrier frequency (e.g., fC≥4 GHz or, as another example, fC≥10 GHz). In this manner, power consumption can be reduced and, in some embodiments, the amount of time needed to synchronize to the network can be reduced by using the XO1 26-1, which has a smaller tolerance than the XO2 26-2, during synchronization. Note that these advantages are only examples.

Note that while the use of the XOs 26-1 and 26-2 is illustrated in the example of FIG. 3 as being used by the RF PLL 44 for controlling the LO signal for the receiver 22, the XOs 26-1 and 26-2 may additionally or alternatively be used by an RF PLL to provide a LO signal used for upconversion in a transmitter (not shown) of the wireless device 18.

Figure 4:
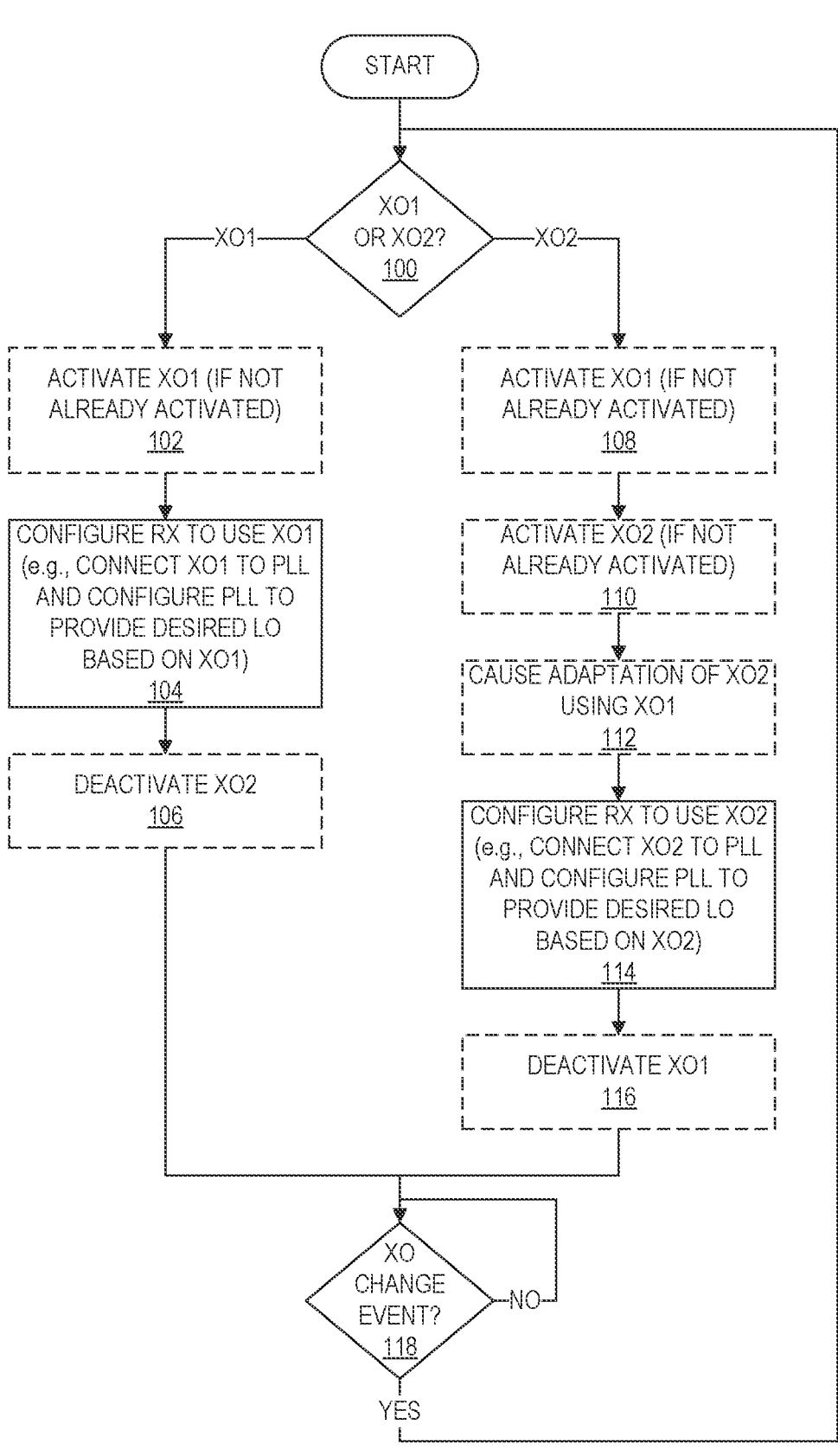
FIGS. 4 through 7 are flow charts that illustrate the operation of the wireless device and, in particular, a control unit of the wireless device to control a receiver of the wireless device to use either a lower-frequency reference crystal oscillator (XO) or a higher-frequency XO according to some embodiments of the present disclosure.

FIG. 4 is a flow chart that illustrates the operation of the wireless device 18 and, in particular, the control unit 24 to control the receiver 22 to use either the XO1 26-1 or the XO2 26-2 according to some embodiments of the present disclosure. Optional steps are illustrated in dashed boxes. As illustrated, the control unit 24 decides whether the receiver 22 should be configured to use the XO1 26-1 or the XO2 26-2 (step 100). As discussed below, in some embodiments, this decision is based on a synchronization state of the wireless device 18 towards a radio access node 14, a connection state of the wireless device 18 (e.g., RRC IDLE (Dormant State) or RRC CONNECTED or similar states), and/or the carrier frequency fC of the desired receive signal (i.e., the carrier frequency of the radio access node 14). More specifically, in some embodiments, the control unit 24 decides that the receiver 22 is to use the XO1 26-1 if the wireless device 18 is in an OOS state and use the XO2 26-2 if the wireless device 18 is in a sync state. In some other embodiments, the control unit 24 decides that the receiver 22 is to use the XO1 26-1 if the wireless device 18 is in one connection state (e.g., an idle or dormant state) and use the XO2 26-2 if the wireless device 18 is in another state (e.g., a connected or active state). In some other embodiments, the control unit 24 decides that the receiver 22 is to use the XO1 26-1 if the carrier frequency fC used by the radio access node 14 is less than a predefined or preconfigured threshold (e.g., 4 GHz or 10 GHz) and use the XO2 26-2 if the carrier frequency fC is greater than or equal to the predefined or preconfigured threshold.

The control unit 24 then configures the receiver 22 in accordance with the decision made in step 100. More specifically, upon deciding that the receiver 22 is to use the XO1 26-1, the control unit 24 activates the XO1 26-1 by, e.g., asserting the XO activation signal (see XO1 ACT/DEACT in FIG. 3) if the XO1 26-1 is not already activated (step 102). Note that, in some embodiments, the XO1 26-1 is always activated, in which case step 102 does not need to be performed. In some other embodiments, the XO1 26-1 may at times be deactivated, in which case the control unit 24 activates the XO1 26-1 if the XO1 26-1 is not already activated.

Once the XO1 26-1 is activated, the control unit 24 configures the receiver 22 to use the XO1 26-1 (step 104). The exact manner in which the receiver 22 is configured to use the XO1 26-1 will vary depending on the particular implementation of the receiver 22, as will be appreciated by one of ordinary skill in the art. However, in the example of FIG. 3, the control unit 24 configures the receiver 22 to use the XO1 26-1 by connecting the XO1 26-1 to the RF PLL 44 by, in this example, closing the switch 48-1 and configuring the RF PLL 44 (e.g., configuring one or more settings of the RF PLL 44 such as, for example, one or more divider values) based on the frequency of the XO1 26-1 such that, the CO 46 is controlled to provide the desired LO frequency. As a simple, non-limiting example, the output frequency of the CO 46 is controlled by the RF PLL 44 to be N times the reference frequency. So, if the XO1 26-1 is connected to the RF PLL 44, the RF PLL 44 controls the CO 46 such that the output frequency of the CO 46 is N times the frequency of the XO1 26-1. Therefore, in this example, the control unit 24 configures the parameter N of the RF PLL 44 such that N times the frequency of the XO1 26-1 is equal to the desired LO frequency, which for direct downconversion to baseband is equal to the carrier frequency fC. After configuring the receiver 22 to use the XO1 26-1, the control unit 24 optionally deactivates the XO2 26-2 if the XO2 26-2 was active by, e.g., de-asserting the XO2 ACT/DEACT signal (see FIG. 3) (step 106). By deactivating the XO2 26-2, power consumption is reduced.

Returning to step 100, upon deciding that the receiver 22 is to use the XO2 26-2, the control unit 24 activates the XO1 26-1 by, e.g., asserting the XO activation signal (see XO1 ACT/DEACT in FIG. 3) if the XO1 26-1 is not already activated (step 108). Note that, in some embodiments, the XO1 26-1 is always activated, in which case step 108 does not need to be performed. In some other embodiments, the XO1 26-1 may at times be deactivated, in which case the control unit 24 activates the XO1 26-1 if the XO1 26-1 is not already activated. Also, in this example, the XO1 26-1 is first tuned and then used to tune the XO2 26-2. As such, the XO1 26-1 is activated in step 108. However, in other embodiments, the XO2 26-2 is not tuned based on the XO1 26-1 and, as such, step 108 is not needed.

The control unit 24 activates the XO2 26-2 by, e.g., asserting the XO activation signal (see XO2 ACT/DEACT in FIG. 3) if the XO2 26-2 is not already activated (step 110). Note that, in some embodiments, the XO2 26-2 is always activated, in which case step 110 does not need to be performed. In some other embodiments, the XO2 26-2 may at times be deactivated, in which case the control unit 24 activates the XO2 26-2 if the XO2 26-2 is not already activated. In this example embodiment, the control unit 24 causes adaptation of the XO2 26-2 using the XO1 26-1 (step 112). For example, if the wireless device 18 is not already synchronized to the carrier frequency fC of the radio access node 14, the control unit 24 may first configure the receiver 22 to use the XO1 26-1 as described above and perform an initial synchronization process whereby the XO1 26-1 and the LO signal are tuned to the carrier frequency fC. Once the wireless device 18 is synchronized to the radio access node 14 either as part of step 112 or as part of a previously performed synchronization process and the XO2 26-2 is activated, the control unit 24 enables the XO2 control system 28. The XO2 control system 28 may be, for example, a PLL or some other circuitry that adapts, e.g., a voltage or digital setting of the XO2 26-2 to track the frequency of the XO1 26-1. For example, if the XO1 frequency is 26 MHz and the XO2 frequency is desired to be 104 MHz and if the XO1 26-1 is fine-tuned during synchronization to the carrier frequency fC, then this fine-tuning can at least initially be performed for the XO2 26-2 by adapting the XO2 26-2 such that its output frequency is exactly four times the XO1 frequency, in this example.

Once the XO2 26-2 is activated and, optionally, adapted using the XO1 26-1, the control unit 24 configures the receiver 22 to use the XO2 26-2 (step 114). The exact manner in which the receiver 22 is configured to use the XO2 26-2 will vary depending on the particular implementation of the receiver 22, as will be appreciated by one of ordinary skill in the art. However, in the example of FIG. 3, the control unit 24 configures the receiver 22 to use the XO2 26-2 by connecting the XO2 26-2 to the RF PLL 44 by, in this example, closing the switch 48-2 and configuring the RF PLL 44 (e.g., configuring one or more settings of the RF PLL 44 such as, for example, one or more divider values) based on the frequency of the XO2 26-2 such that the CO 46 is controlled to provide the desired LO frequency. As a simple, non-limiting example, the output frequency of the CO 46 is controlled by the RF PLL 44 to be N times the reference frequency. So, if the XO2 26-2 is connected to the RF PLL 44, the RF PLL 44 controls the CO 46 such that the output frequency of the CO 46 is N times the frequency of the XO2 26-2. Therefore, in this example, the control unit 24 configures the parameter N of the RF PLL 44 such that N times the frequency of the XO2 26-2 is equal to the desired LO frequency, which for direct downconversion to baseband is equal to the carrier frequency fC. After configuring the receiver 22 to use the XO2 26-2, the control unit 24 optionally deactivates the XO1 26-1 if the XO1 26-1 was active by, e.g., de-asserting the XO1 ACT/DEACT signal (see FIG. 3) (step 116). By deactivating the XO1 26-1, power consumption is reduced.

Whether using the XO1 26-1 or the XO2 26-2 the control unit 24 determines whether an XO change event has occurred (step 118). In other words, the control unit 24 determines whether an event that may result in a change in which of the XOs 26-1 and 26-2 is to be used has occurred. For ample, in some embodiments, the control unit 24 decides which XO to use based on the sync state of the wireless device 18 and, as such, the control unit 24 detects ail XO change event when the sync state of the wireless device 18 changes. In some other embodiments, the control unit 24 decides which XO to use based on a connection state of the wireless device 18 and, as such, the control unit 24 detects an XO change event hen the connection state of the wireless device 18 changes. In yet another example, in some embodiments, the control unit 24 decides which XO to use based on the carrier frequency fC and, as such, the control unit 24 detects an XO change event when the carrier frequency fC changes or when an event (e.g., a handover) that may result in a change in the carrier frequency fC has occurred. If no XO change event is detected, the control unit 24 continues to monitor for an XO change event. If an XO change event is detected, the process returns to step 100 where the control unit 24 decides whether to use the XO1 26-1 or the XO2 26-2. The process then continues as described above.

Figure 5:
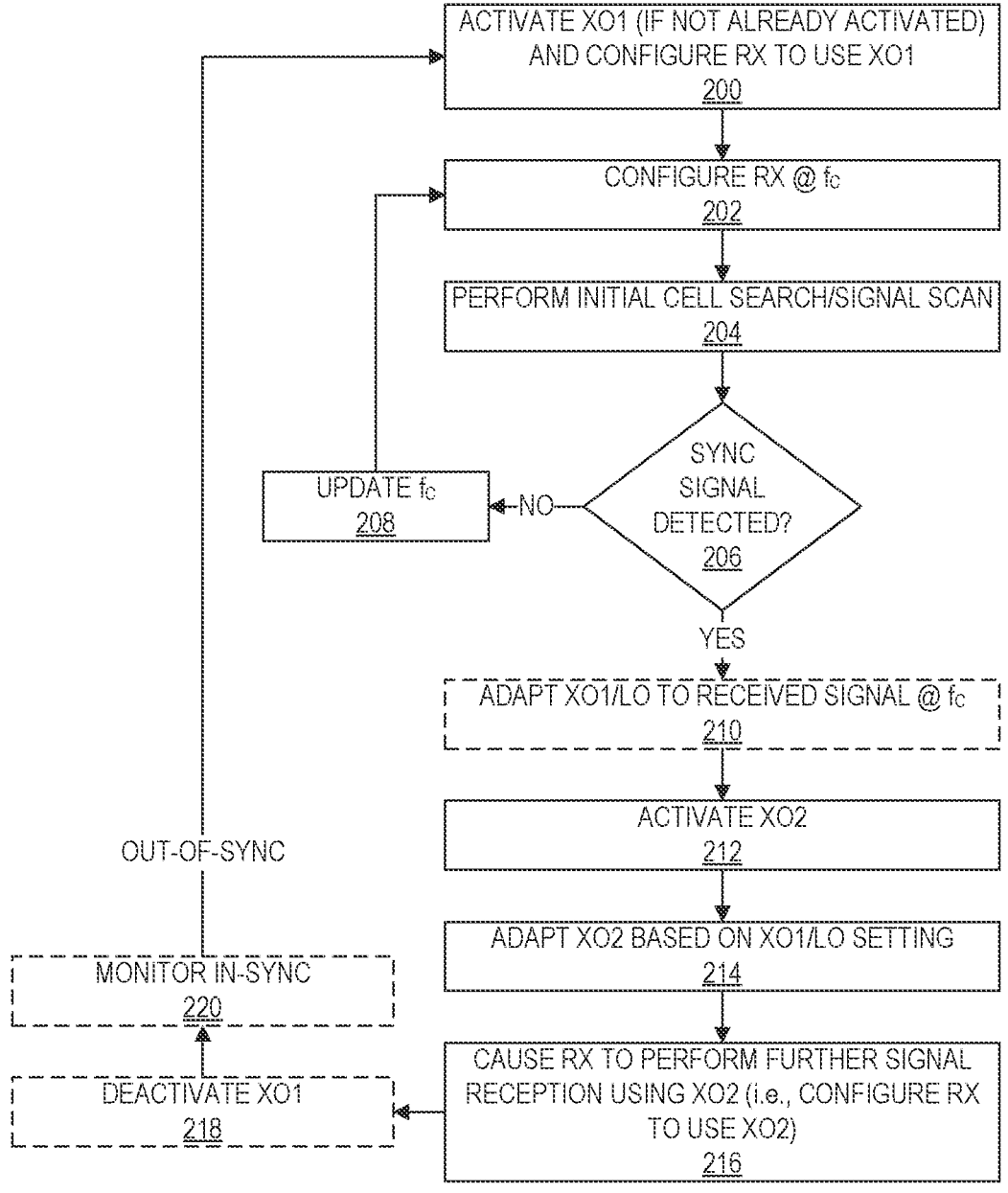

FIG. 5 is a flow chart that illustrates the operation of the wireless device 18 and in particular the control unit 24 according to some embodiments of the present disclosure. This process is one particular implementation of the process of FIG. 4. In general, using the process of FIG. 5, the control unit 24 configures the receiver 22 to use the XO1 26-1 during initial synchronization to the carrier frequency IC of the radio access node 14. Once synchronization is complete, the control unit 24 configures the receiver 22 to use the XO2 26-2.

Before discussing the process of FIG. 5 in detail, a brief discussion of sonic problems associated with using a high frequency XO during initial synchronization is presented. The larger uncertainty in frequency (i.e., the larger tolerance) for high frequency XOs (i.e., >100 MHz XOs) substantially impacts the time it takes to reach initial synchronization with the network and may also pose a problem in handover events. For instance, assuming a carrier frequency of 2 GHz, a 26 MHz XO has an initial uncertainty of 10 parts-per-million (ppm). To do initial cell search in LTE/ Wideband Code Division Multiple Access (WCDMA) High Speed Packet Access (HSPA), a frequency gridding around a hypothesized carrier frequency is needed, with a frequency grid of around 10 kilohertz (kHz). Hence, up to five to six searches are needed for each possible carrier frequency. Once the synchronization signal (e.g., Primary Synchronization Signal/Secondary Synchronization Signal (PSS/SSS), Primary Synchronization Channel Secondary Synchronization Channel (P-SCH/S-SCH)) is detected for a certain frequency hypothesis, the XO can be adjusted and the correct carrier frequency (e.g., below 100 Hertz (Hz) error) can be achieved. For a 200 MHz XO, the corresponding search grid should be four to five times larger (i.e., 20 to 30 frequency hypothesis for each carrier assuming 2 GHz, for higher carrier frequency even more frequency hypothesis). Hence, the initial synchronization time might be much longer using >100 MHz XOs, Conversely, using 26 MHz XOs for initial synchronization will reduce initial synchronization time, but could not manage the stringent phase noise requirements needed for 1+gigabits per second (Gb/s) data rates above 10 GHz carrier frequency. Using the process of FIG. 5, the wireless device 18 addresses these problems.

As illustrated in FIG. 5, prior to synchronization, the control unit 24 activates the XO1 26-1 if not already activated and configures the receiver 22 to use the XO1 26-1 (step 200). More specifically, the control unit 24 activates the XO1 26-1 by, e.g., asserting the XO activation signal (see XO1 ACT/DEACT in FIG. 3) if the XO1 26-1 is not already activated. Note that, in some embodiments, the XO1 26-1 is always activated, in which case the XO1 26-1 does not need to be activated in step 200. In some other embodiments, the XO1 26-1 may at times be deactivated, in which case the control unit 24 activates the XO1 26-1 if the XO1 26-1 is not already activated. Once the XO1 26-1 is activated, the control unit 24 configures the receiver 22 to use the XO1 26-1. The exact manner in which the receiver 22 is configured to use the XO1 26-1 will vary depending on the particular implementation of the receiver 22, as will be appreciated by one of ordinary skill in the art. However, in the example of FIG. 3, the control unit 24 configures the receiver 22 to use the XO1 26-1 by connecting the XO1 26-1 to the RF PLL 44 by, in this example, closing the switch 48-1 and configuring the RE PLL 44 (e.g., configuring one or more settings of the RF PLL 44 such as, for example, one or more divider values) based on the frequency of the XO1 26-1 such that the CO 46 is controlled to provide the desired LO frequency. While not illustrated, after configuring the receiver 22 to use the XO1 26-1, the control unit 24 optionally deactivates the XO2 26-2 if the XO2 26-2 was active by, e.g., dc-asserting the XO2 ACT/DEACT signal (see FIG. 3). By deactivating the XO2 26-2, power consumption is reduced.

The receiver 22 is enabled (if needed), and the control unit 24 configures the receiver 22 to receive at a (hypothesized) carrier frequency fC (step 202). The carrier frequency fC may be determined by, e.g., the control unit 24 having historical information on possible carrier frequencies for the radio access nodes 14. This configuration of the receiver 22 includes connecting the XO1 26-1 to the RF PLL 44 and configuring the RF PLL 44 (e.g., configuring a divider value(s) for the RF PLL 44) such that, based on the frequency of the XO1 26-1, the RF PLL 44 controls the CO 46 to output the desired LO frequency.

Next, an initial cell search/scan is performed, where the wireless device 18 searches for synchronization signals (e.g., PSS/SSS in LTE for instance) transmitted by a radio access node 14 (step 204). Cell search procedures are well known in the art and, as such, the cell search procedure is not described here. The control unit 24 determines whether a synchronization signal has been detected (step 206). In this manner, the control unit 24 is deciding whether to configure the wireless device 18 to use the XO2 26-2 or to continue to use the XO1 26-1. This step is therefore one example implementation of step 100 of FIG. 4. If a synchronization signal has not been detected, the control unit 24 updates the (hypothesized) carrier frequency fC (step 208) and the process returns to step 202. Once a synchronization signal is detected, the control unit 24 may adapt or fine tune the XO1 26-1 and, in particular, the LO frequency to the carrier frequency fC of the received signal (step 210). Again, this adaption process is well known in the art and, as such, the details are not repeated herein. However, in general, this adaptation may be performed by adapting the RF PLL 44 (e.g., adapting the divider value(s) of the RF PLL 44) and/or by adapting the XO1 26-1 via, e.g., a voltage or digital setting of the XO1 26-1. For direct downconversion of the received signal from the carrier frequency fC to baseband, this adaptation results in the LO frequency being substantially matched to the actual carrier frequency fC of the receive signal to within some predefined tolerance (e.g., 100 Hz). In addition or alternatively, the adaptation may be performed by configuring a de-rotator in the digital processor 42 to compensate for the frequency error in the digital domain.

Once synchronization is complete, the XO2 26-2 is activated (step 212) and adapted based on the XO1 26-1 (e.g., the output of the XO1 26-1) (step 214). More specifically, in the example of FIG. 3, the XO2 control system 28 is activated (if not already active). The XO2 control system 28 then adapts the XO2 26-2 based on, in this example, the output of XO1 26-1, to thereby fine tune the frequency of the XO2 26-2. The XO2 control system 28 may be, for example, a PLL and the XO1 26-1 serves as a reference for this PLL and this PLL in turn controls, e.g., a voltage or digital setting of the XO2 26-2 to track the frequency of the XO1 26-1.

Once the XO2 26-2 is active and tuned, the control unit 24 configures the receiver 22 to perform further signal reception using the XO2 26-2 (step 216). In other words, the control unit 24 configures the receiver 22 to use the XO2 26-2.

Again, as discussed above, the exact manner in which the receiver 22 is configured to use the XO2 26-2 will vary depending on the particular implementation of the receiver 22, as will be appreciated by one of ordinary skill in the art. However, in the example of FIG. 3, the control unit 24 configures the receiver 22 to use the XO2 26-2 by connecting the XO2 26-2 to the RF PLL 44 by, in this example, closing the switch 48-2 and configuring the RF PLL 44 (e.g., configuring one or more settings of the RF PLL 44 such as, for example, one or more divider values) based on the frequency of the XO2 26-2 such that the CO 46 is controlled to provide the desired LO frequency.

After configuring the receiver 22 to use the XO2 26-2, the control unit 24 optionally deactivates the XO1 26-1 by, e.g., de-asserting the XO1 ACT/REACT signal (see FIG. 3) (step 218). Notably, step 218 may be performed if the control input to the XO2 26-2 can be held constant while disabling the XO2 control system 28. Alternatively, the XO1 26-1 is kept active as an input to the XO2 control system 28 that in turn continuously maintains lock between the XO2 26-2 and the XO1 26-1.

Optionally, in some embodiments, the control unit 24 monitors the synchronization state of the wireless device 18 (step 220). Once the wireless device 18 is determined to be OOS, the process returns to step 200 and is repeated. The wireless device 18 may be determined to be OOS based on any suitable criteria such as, e.g., Long DRX cycles where the XO2 26-2 has been disabled for power saving purposes, Large temperature variations (e.g., due to turning a power amplifier of the wireless device 18 on or off), and/or Being OOS in terms of no reliable reception of data from the radio access node 14 (i.e., a Radio Link Failure (RLF) or a radio link problem).

Figure 6:
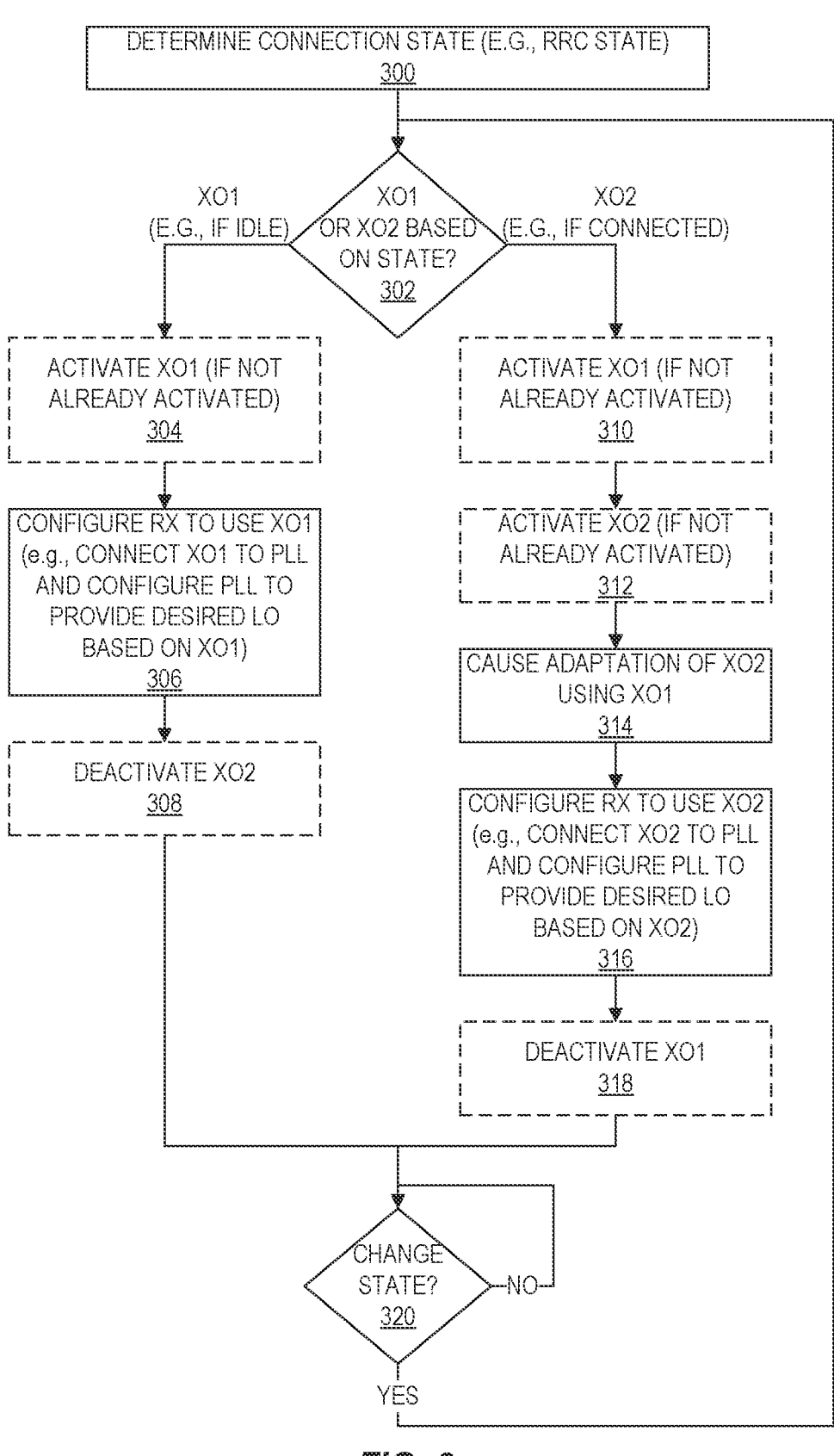

FIG. 6 is a flow chart that illustrates the operation of the wireless device 18 and, in particular, the control unit 24 according to some embodiments of the present disclosure. This embodiment is similar to that of FIG. 4 but where the decision as to which of the XOs 26-1 and 26-2 to be used is based on a connection state of a connection of the wireless device 18 to a radio access node 14. As illustrated, the control unit 24 determines a connection state of the wireless device 18 with respect to a serving or camping cell or beam (step 300). In some embodiments, the connection state is either idle state or connected state. For example, for LTE, the connection state is the RRC state, which can be either IDLE (or Dormant in 5G NR) or CONNECTED (or active). However, other wireless systems may have different connection states. For example, in 5G, there may be more than two connection states.

The control unit 2.4 then decides which XO to use based on the connection state of the wireless device 18 (step 302). For example, in some embodiments, the control unit 24 decides to use the XO1 26-1 if the wireless device 18 is in one connection state (e.g., idle state such as, for example, RRC IDLE in LTE) and decides to use the XO2 26-2 if the wireless device 18 is in another connection state (e.g., connected state such as, for example, RRC CONNECTED in LTE). Note that the terms "idle" and "connected" state as used herein are only examples. Other names for different connection states may be used, such as dormant and active, particularly in future cellular communications networks (e.g., 5G networks). The key is that the receiver 22 is configured to use different XOs 26-1, 26-2 in different connection states, which enables the lower-frequency XO1 26-1 to be used when desirable or beneficial to do so (e.g., when using low data rates, paging, long DRX. (power saving reason and short resync time needed)) and enables the higher-frequency XO2 26-2 to be used when desirable or beneficial to do so (e.g., when high performance reception is desired such as, e.g., reception using MIMO, higher order modulation, etc.). The process then proceeds as described above with respect to FIG. 4 to either use the XO1 26-1 (steps 304-308, which correspond to steps 202-206 of FIG. 4) or use the XO2 26-2 (steps 310-318, which correspond to steps 108-116 of FIG. 4) in accordance with the decision made in step 302. The control unit 24 then decides whether the connection state of the wireless device 18 has changed (step 320). If not, the control unit 24 continues to monitor for a change in the connection state. Upon detecting a change in the connection state, the process then proceeds to step 302 and is repeated taking into consideration the new connection state of the wireless device 18.

With respect to the process of FIG. 6, the idea is that in idle mode, where only paging and mobility measurement are needed, the lower frequency XO1 26-1 can be used since such transmissions are typically single layer and low order Modulation and Coding Scheme (MCS), and since sync is shorter (less drift between DRX cycles). Thus, by using the process of FIG. 6, the low-frequency XO1 26-1 is used if the wireless device 18 is in idle mode, and the high-frequency XO2 26-2 is used if the wireless device 18 is in connected mode.

Figure 7:
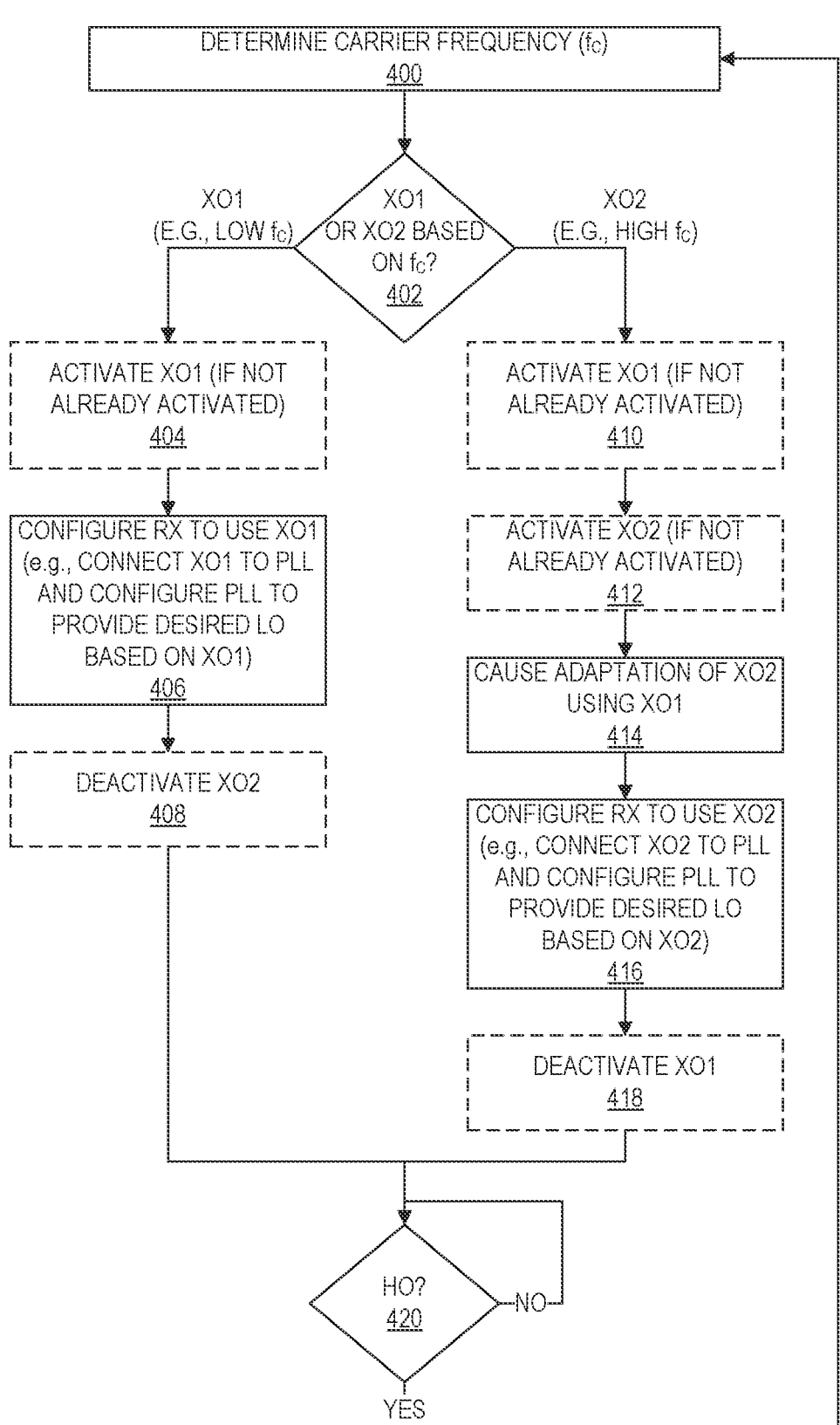

FIG. 7 is a flow chart that illustrates the operation of the wireless device 18 and, in particular, the control unit 24 according to some embodiments of the present disclosure. This embodiment is similar to that of FIG. 4 but where the decision as to which of the XOs 26-1 and 26-2 to be used is based on the carrier frequency fC of the received signal. As illustrated, the control unit 24 determines the carrier frequency fC of the received signal or the signal to be received (step 400). The control unit 24 then decides which XO to use based on the carrier frequency fC (step 402). For example, in some embodiments, the control unit 24 decides to use the XO1 26-1 if the carrier frequency fC is less than a predefined or preconfigured threshold and decides to use the XO2 26-2 if the carrier frequency fC is greater than the predefined or preconfigured threshold. The predefined or preconfigured threshold may vary but, as one example, this threshold may be 4 GHz or 10 GHz.

It should be noted that, in sonic embodiments, the wireless device 18 may include separate receivers (i.e., as part of separate transceivers) for different carrier frequencies. For example, the wireless device 18 may include a first transceiver for carrier frequencies that are less than, e.g., 6 GHz and a second transceiver for carrier frequencies that are greater than or equal to, e.g., 6 GHz. In this example, the XO1 26-1 could be used for either transceiver, whereas the XO2 26-2 may only be used for the higher frequency transceiver (e.g., the >6 GHz transceiver or millimeter wave (mmW) transceiver). Thus, in this example, if the desired carrier frequency fC is less than, e.g., 6 GHz, then the first, lower frequency transceiver is used and, as such, the control unit 24 configures the receiver of the first, lower-frequency transceiver to use the XO1 26-1. Conversely, if the desired carrier frequency fC is greater than, e.g., 6 GHz, then the second, higher-frequency transceiver is used and, as such, the control unit 24 configures the receiver of the second, higher-frequency transceiver to use the XO2 26-2 or, in some embodiments, either the XO1 26-1 or the XO2 26-2 based on, e.g., synchronization state and/or connection state, as described above, Thus, in this example, the control unit 24 decides which receiver to use and which XO to use based on the desired carrier frequency fC.

The process then proceeds as described above with respect to FIG. 4 to either use the XO1 26-1 (steps 404-408, which correspond to steps 202-206 of FIG. 4) or use the XO2 26-2 (steps 410-418, which correspond to steps 108-116 of FIG. 4) in accordance with the decision made in step 402. The control unit 24 then decides whether a handover (1710) over is to be performed (e.g., whether a handover command has been received) (step 420). The handover can be an inter-frequency handover or an inter-Radio Access Technology (RAT) handover, for example. The Landover is from one cell or beam (source) to another cell or beam (target). The target may operate on a different carrier frequency than the source and, as such, the control unit 24 re-evaluates which XO to use. In other words, a handover indicates that there may be a new carrier frequency fC. Thus, if a handover is to be performed, the process returns to step 400 to determine the new carrier frequency fC for the target cell or beam and then repeated taking into consideration the new carrier frequency fC.

The following acronyms are used throughout this disclosure.

2G Second Generation
3G Third Generation
3GPP Third Generation Partnership Project
4G Fourth Generation
5G Fifth Generation
ADC Analog-to-Digital Converter
ASIC Application Specific Integrated Circuit
BPF Band-Pass Filter
BPSK Binary Phase Shift Keying
CMOS Complementary Metal-Oxide-Semiconductor
CN Core Network
CO Controlled Oscillator
CPU Central Processing Unit
dB Decibel
dBc/Hz Decibels Relative to the Carrier per Hertz
DRX Discontinuous Reception
eNB Enhanced or Evolved Node B
FoM Figure of Merit
FPGA Field Programmable Gate Array
Gb/s Gigabits per Second
GHz Gigahertz
HO Handover
HSPA High Speed Packet Access
Hz Hertz
IF Intermediate Frequency
kHz Kilohertz
LNA Low-Noise Amplifier
LO Local Oscillator
LTE Long Term Evolution
MA-MIMO Multi-Antenna Multiple Input Multiple Output
MBB Mobile Broadband
MCS Modulation and Coding Scheme
MHz Megahertz
MME Mobility Management Entity
mmW Millimeter Wave
MTC Machine Type Communication
mW Milliwatt
OOS Out-of-Sync
PDN Packet Data Network
P-GW Packet Data Network Gateway
PLL Phase Locked Loop
ppm Part-Per-Million
P-SCH Primary Synchronization Channel
PSS Primary Synchronization Signal
QAM Quadrature Amplitude Modulation
RAN Radio Access Network
RAT Radio Access Technology
RF Radio Frequency
RLF Radio Link Failure
RRC Radio Resource Control
SCEF Service Capability Exposure Function
SNR Signal-to-Noise Ratio
S-SCH Secondary Synchronization Channel
SSS Secondary Synchronization Signal
UE User Equipment
VCO Voltage Controlled Oscillator
WCDMA Wideband Code Division Multiple Access
XO Reference Crystal Oscillator Those skilled in the art will recognize improvements and modifications to the embodiments of the present disclosure.

All such improvements and modifications are considered within the scope of the concepts disclosed herein and the claims that follow.

What is claimed is:

1. A method of operation of a wireless device, the method comprising:
    deciding whether to configure a receiver of the wireless device to use a first or a second reference crystal oscillator for generating a local oscillator (LO) signal for the receiver, wherein the deciding is based on whether the wireless device is synchronized to a wireless network, and wherein the first reference crystal oscillator operates at a first reference frequency and the second reference crystal oscillator operates at a second reference frequency that is greater than the first reference frequency; and
    configuring the receiver to use the first reference crystal oscillator or the second reference crystal oscillator, in accordance with the decision.

2. The method according to claim 1, wherein the step of deciding comprises deciding to configure the receiver to use the first reference crystal oscillator responsive to the wireless device not being synchronized to the wireless network.

3. The method according to claim 1, wherein the step of deciding comprises deciding to configure the receiver to use the second reference crystal oscillator responsive to the wireless device being synchronized to the wireless network.

4. The method according to claim 1, wherein configuring the receiver of the wireless device to use the first reference crystal oscillator comprises connecting the first reference crystal oscillator to a reference frequency input of a phase locked loop (PLL) used in generating the LO signal and configuring the PLL for use of the first reference frequency as the reference frequency of the PLL.

5. The method according to claim 4, wherein configuring the receiver of the wireless device to use the second reference crystal oscillator comprises connecting the second reference crystal oscillator to the reference frequency input of the PLL and configuring the PLL for use of the second reference frequency as the reference frequency of the PLL.

6. The method according to claim 1, wherein the first reference frequency is less than or equal to 52 megahertz (MHz) and the second reference frequency is greater than or equal to 100 MHz.

7. The method according to claim 1, wherein the receiver is one among at least two receivers of the wireless device, such that the method comprises selecting the receiver as a selected one from among at least two receivers of the wireless device and deciding whether to configure the selected receiver to use the first reference crystal oscillator or the second reference crystal oscillator.

8. The method according to claim 1, wherein the step of deciding comprises:
    performing an initial cell search via the receiver, while the receiver is configured to use the first reference crystal oscillator and the second reference crystal oscillator is deactivated; and
    responsive to detecting a synchronization signal during the initial cell search:
        tuning the first crystal oscillator in dependence on the synchronization signal; and
        activating the second reference crystal oscillator, tuning the second reference crystal oscillator based on the first reference crystal oscillator, and then switching the receiver from use of the first crystal oscillator to use of the second reference crystal oscillator.

9. The method according to claim 8, further comprising deactivating the first reference crystal oscillator after switching the receiver to use of the second reference crystal oscillator.

10. The method according to claim 8, further comprising, in response to losing synchronization with the wireless network, switching the receiver from use of the second reference crystal oscillator back to use of the first reference crystal oscillator.

11. A wireless device configured for operation in a wireless network, the wireless device comprising:
    a receiver configured for wirelessly communicating with a radio network node of the wireless network, the receiver having a first reference crystal oscillator that operates at a first reference frequency and a second reference crystal oscillator that operates at a second reference frequency greater than the first reference frequency, and wherein the receiver is configurable to use the first or the second reference crystal oscillator for generating a local oscillator (LO) signal for the receiver; and
    processing circuitry configured to:
        decide whether to configure the receiver to use the first reference crystal oscillator or the second reference crystal oscillator for generating the LO signal for the receiver, wherein the decision is based on whether the wireless device is synchronized to the wireless network; and
        configure the receiver to use the first reference crystal oscillator or the second reference crystal oscillator, in accordance with the decision.

12. The wireless device according to claim 11, wherein the processing circuitry is configured to decide to configure the receiver to use the first reference crystal oscillator, responsive to the wireless device not being synchronized to the wireless network.

13. The wireless device according to claim 11, wherein the processing circuitry is configured to decide to configure the receiver to use the second reference crystal oscillator, in response to the wireless device being synchronized to the wireless network.

14. The wireless device according to claim 11, wherein, to configure the receiver of the wireless device to use the first reference crystal oscillator, the processing circuitry is configured to cause connection of the first reference crystal oscillator to a reference frequency input of a phase locked loop (PLL) used in generating the LO signal, and configuration of the PLL for use of the first reference frequency as the reference frequency of the PLL.

15. The wireless device according to claim 14, wherein, to configure the receiver of the wireless device to use the second reference crystal oscillator, the processing circuitry is configured to output cause connection of the second reference crystal oscillator to the reference frequency input of the PLL, and configuration of the PLL for use of the second reference frequency as the reference frequency of the PLL.

16. The wireless device according to claim 11, wherein the first reference frequency is less than or equal to 52 megahertz (MHz) and the second reference frequency is greater than or equal to 100 MHz.

17. The wireless device according to claim 11, wherein the receiver is one among at least two receivers of the wireless device, and wherein the processing circuitry is configured to select the receiver as a selected one from among at least two receivers of the wireless device and decide whether to configure the selected receiver to use the first reference crystal oscillator or the second reference crystal oscillator.

18. The wireless device according to claim 11, wherein, to make the decision, the processing circuitry is configured to:

perform an initial cell search via the receiver, while the receiver is configured to use the first reference crystal oscillator and the second reference crystal oscillator is deactivated; and responsive to detecting a synchronization signal during the initial cell search:

tune the first crystal oscillator in dependence on the synchronization signal; and activate the second reference crystal oscillator, tune the second reference crystal oscillator based on the first reference crystal oscillator, and then switch the receiver from use of the first crystal oscillator to use of the second reference crystal oscillator.

19. The wireless device according to claim 18, wherein the processing circuitry is configured to deactivate the first reference crystal oscillator after switching the receiver to use of the second reference crystal oscillator.

20. The wireless device according to claim 18, wherein the processing circuitry is configured to switch the receiver from use of the second reference crystal oscillator back to use of the first reference crystal oscillator, in response to the wireless device losing synchronization with the wireless network.

\* \* \* \* \*